US012400383B2

(12) United States Patent
Cheng et al.

(10) Patent No.: US 12,400,383 B2
(45) Date of Patent: Aug. 26, 2025

(54) TRAINING METHOD FOR LEARNING APPARATUS, AND IMAGE GENERATION SYSTEM

(71) Applicant: Hitachi High-Tech Corporation, Tokyo (JP)

(72) Inventors: Zhaohui Cheng, Tokyo (JP); Yasutaka Toyoda, Tokyo (JP); Hideto Dohi, Tokyo (JP); Hiroya Ohta, Tokyo (JP); Hideyuki Kazumi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 176 days.

(21) Appl. No.: 18/279,921

(22) PCT Filed: Mar. 3, 2022

(86) PCT No.: PCT/JP2022/009089
§ 371 (c)(1),
(2) Date: Sep. 1, 2023

(87) PCT Pub. No.: WO2022/186326
PCT Pub. Date: Sep. 9, 2022

(65) Prior Publication Data
US 2024/0144560 A1 May 2, 2024

(30) Foreign Application Priority Data
Mar. 5, 2021 (JP) ................................. 2021-034876

(51) Int. Cl.
G06T 11/60 (2006.01)
G06T 5/80 (2024.01)
G06T 7/13 (2017.01)

(52) U.S. Cl.
CPC ............... *G06T 11/60* (2013.01); *G06T 5/80* (2024.01); *G06T 7/13* (2017.01); G06T 2207/20081 (2013.01)

(58) Field of Classification Search
CPC ...................................................... G06T 11/60
See application file for complete search history.

(56) References Cited

U.S. PATENT DOCUMENTS 9,830,524 B2   11/2017  Sekiguchi et al.
10,559,074 B2   2/2020  Harada et al.
(Continued)

FOREIGN PATENT DOCUMENTS

JP    2013-44547 A    3/2013
JP    5813413 B2    11/2015
(Continued)

OTHER PUBLICATIONS

International Search Report (PCT/ISA/210) issued in PCT Application No. PCT/JP2022/009089 dated May 24, 2022 with English translation (4 pages).
(Continued)

*Primary Examiner* — Shivang I Patel
(74) *Attorney, Agent, or Firm* — Crowell & Moring LLP

(57) ABSTRACT

A training method that performs learning using appropriate low-quality image and high-quality image is provided. The invention is directed to a training method including executing learning by inputting a first image generated under a first image generation condition and a second image generated under a second image generation condition different from the first image generation condition to a learning apparatus that adjusts parameters so as to suppress an error between an input image and a converted image, in which the second image is selected such that an index value extracted from the second image is the same as or has a predetermined rela-
(Continued)

tionship with an index value extracted from the first image, or the second image is output from a second image generation tool different from a first image generation tool for generating the first image.

17 Claims, 13 Drawing Sheets

(56) References Cited

U.S. PATENT DOCUMENTS

| | | | |
|---|---|---|---|
| 2015/0036914 A1 | 2/2015 | Sekiguchi et al. | |
| 2016/0013015 A1* | 1/2016 | Potocek ............... | G02B 21/008 |
| | | | 250/307 |
| 2018/0240225 A1 | 8/2018 | Harada et al. | |
| 2019/0066974 A1* | 2/2019 | Schubert ............. | H01J 37/1472 |
| 2019/0214222 A1* | 7/2019 | Urano ................... | H01J 37/244 |
| 2019/0272971 A1 | 9/2019 | Morishita et al. | |
| 2021/0043418 A1 | 2/2021 | Abe et al. | |
| 2022/0301135 A1 | 9/2022 | Takeshima et al. | |

FOREIGN PATENT DOCUMENTS

| | | |
|---|---|---|
| JP | 2018-137275 A | 8/2018 |
| JP | 2019-153488 A | 9/2019 |
| JP | 6668278 B2 | 3/2020 |
| JP | 2021-26926 A | 2/2021 |
| KR | 10-2021-0018014 A | 2/2021 |
| WO | WO 2020/246150 A1 | 12/2020 |

OTHER PUBLICATIONS

Japanese-language Written Opinion (PCT/ISA/237) issued in PCT Application No. PCT/JP2022/009089 dated May 24, 2022 with English translation (6 pages).
Korean-language Office Action issued in Korean Application No. 10-2023-7030022 dated Nov. 29, 2024 (6 pages).

* cited by examiner

[FIG. 1]
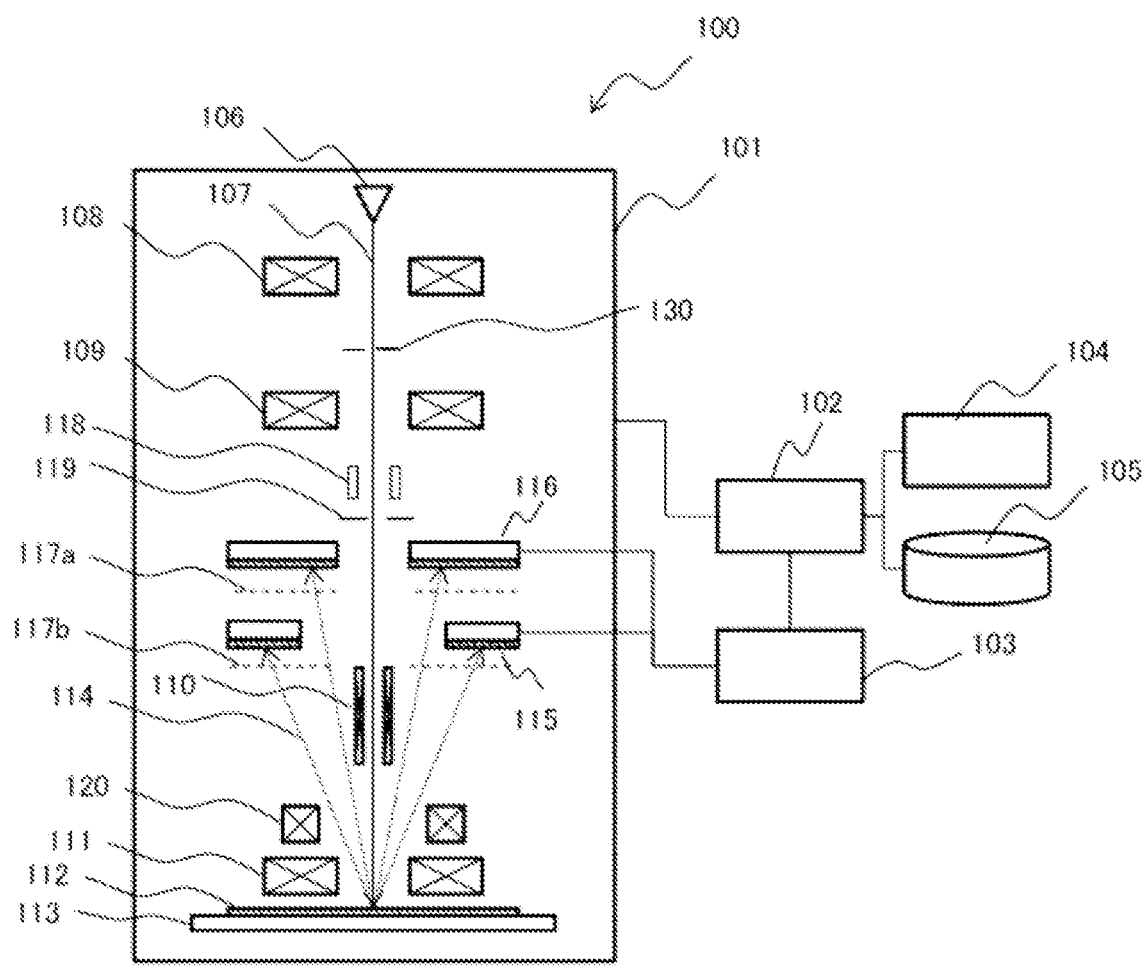

[FIG. 2]
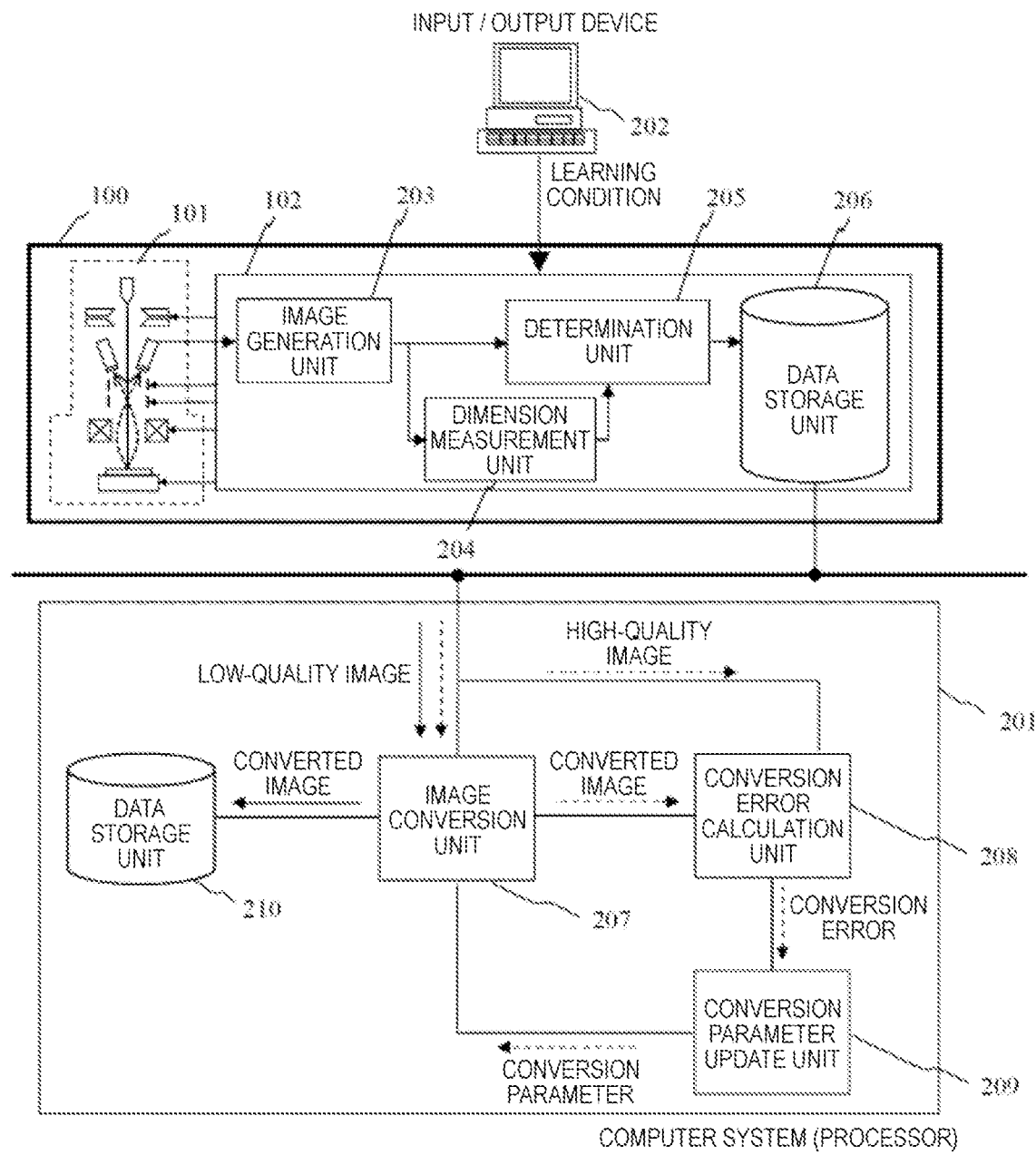

[FIG. 3]
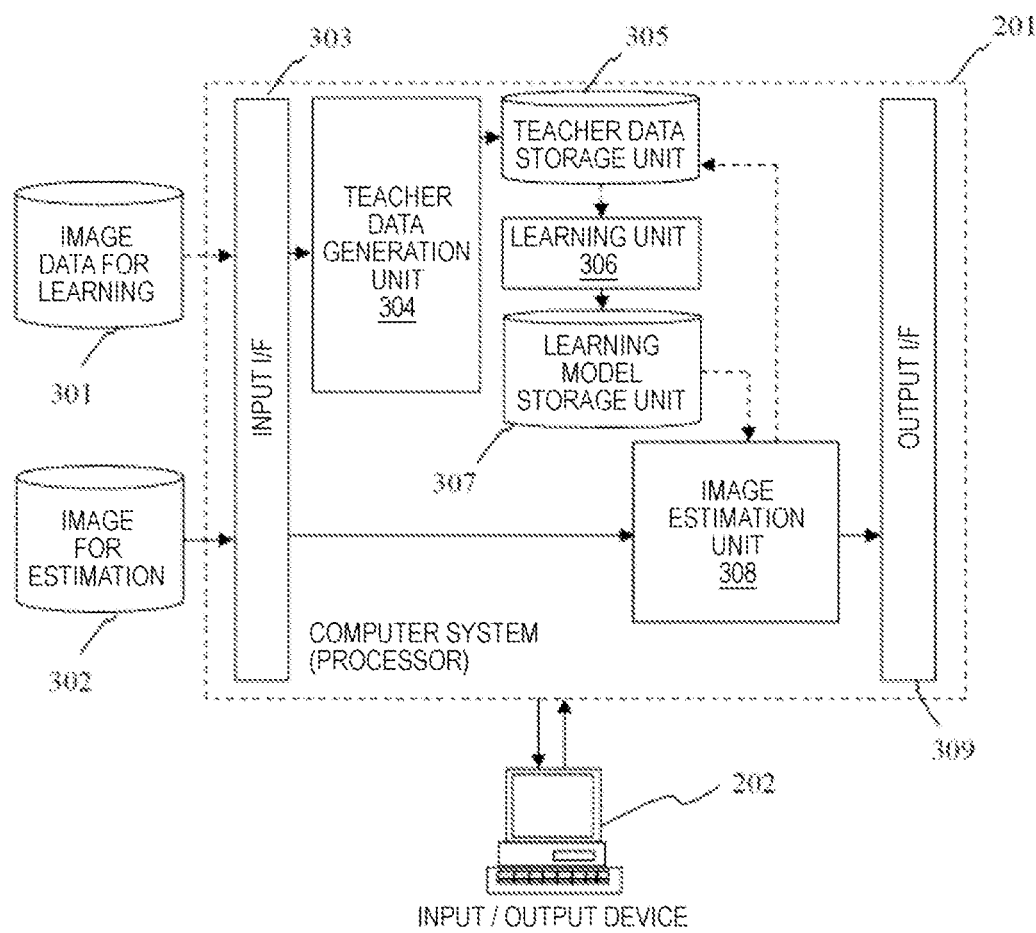

[FIG. 4]
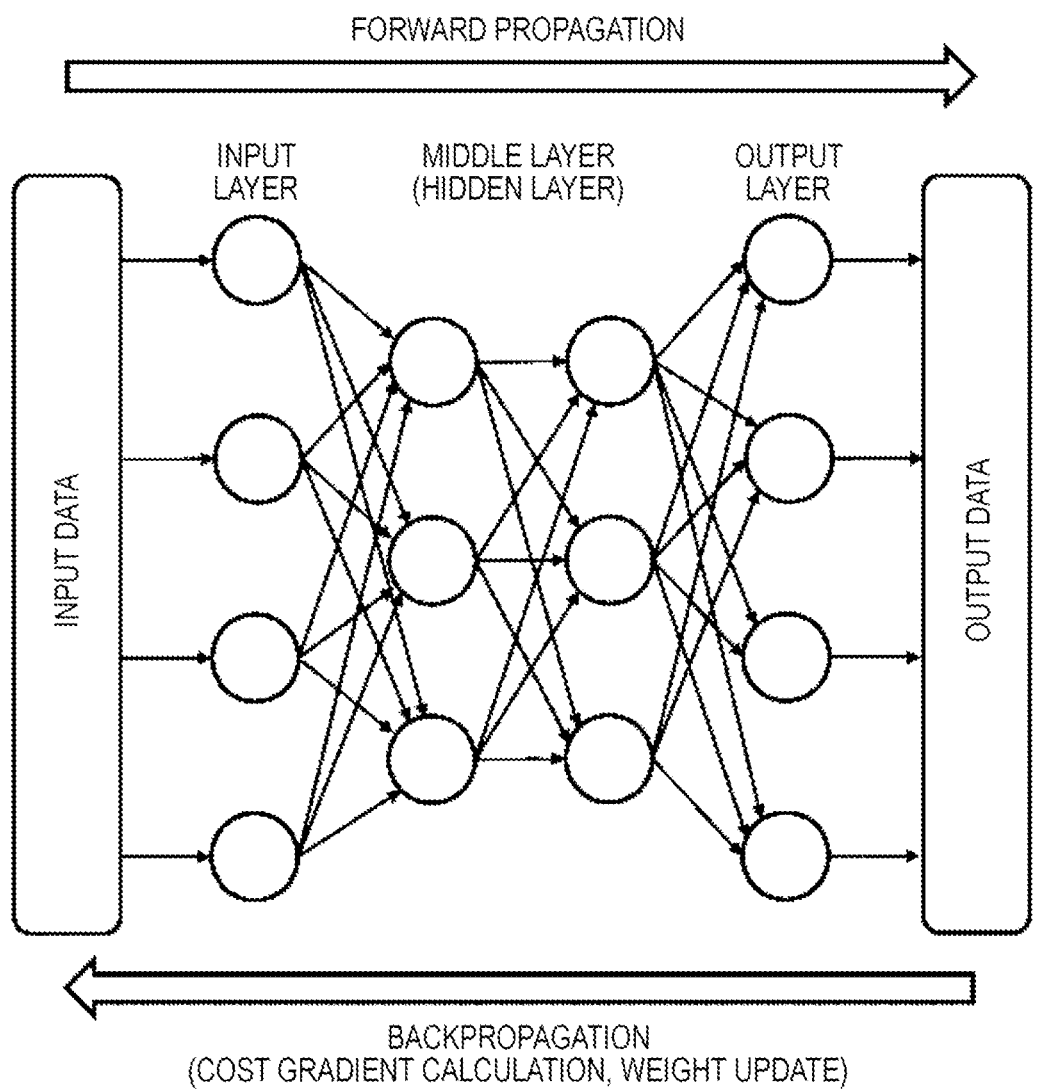

[FIG. 5]
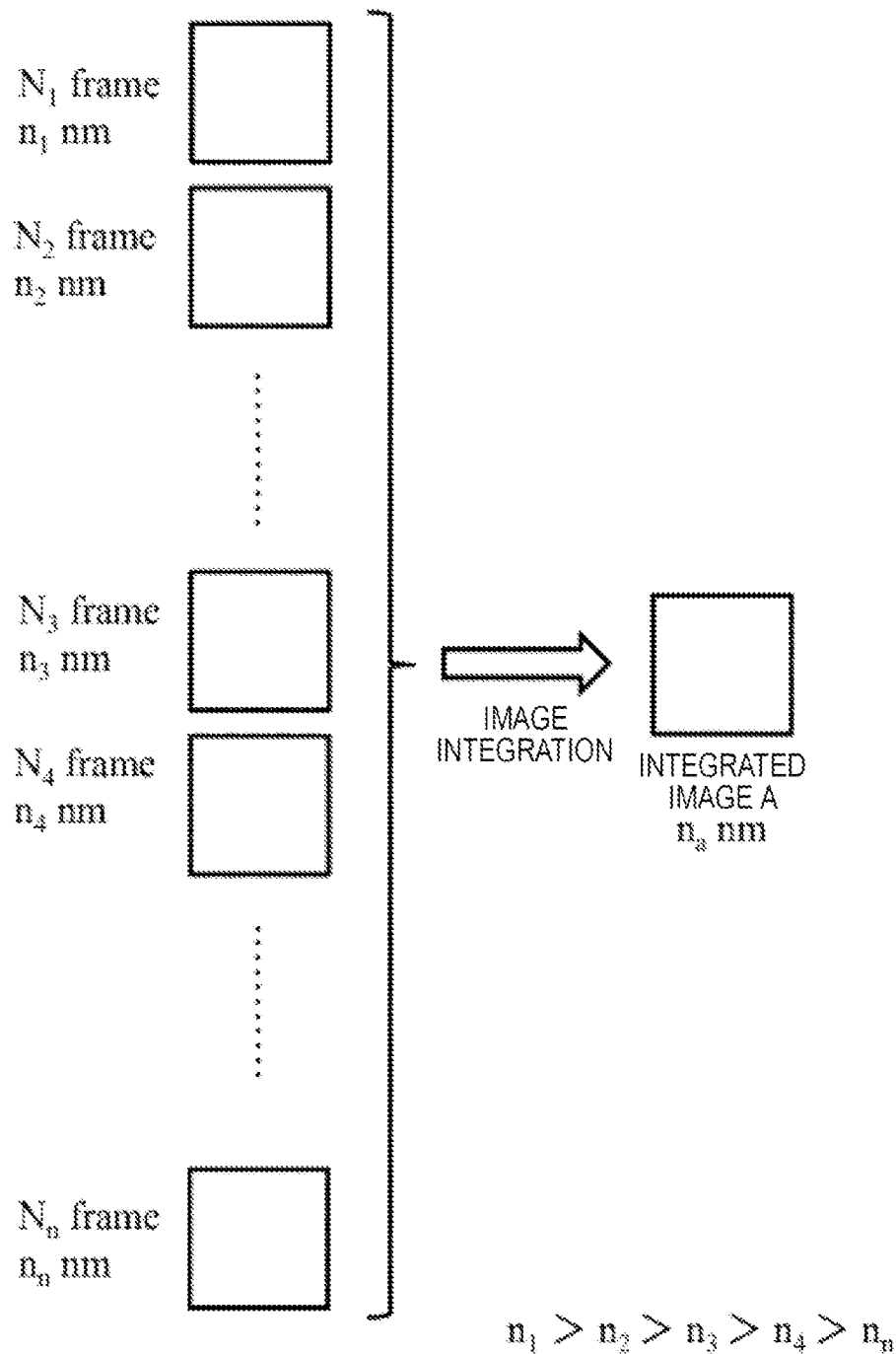

[FIG. 6]
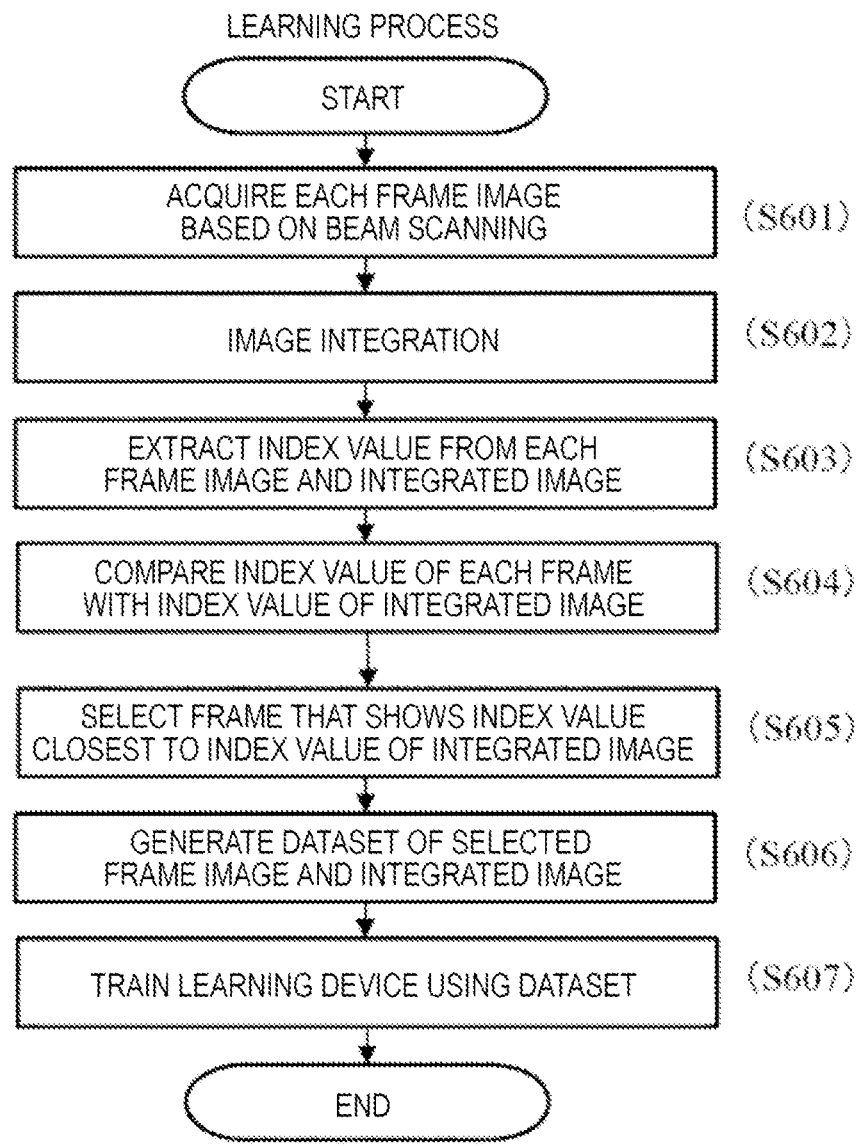

[FIG. 7]
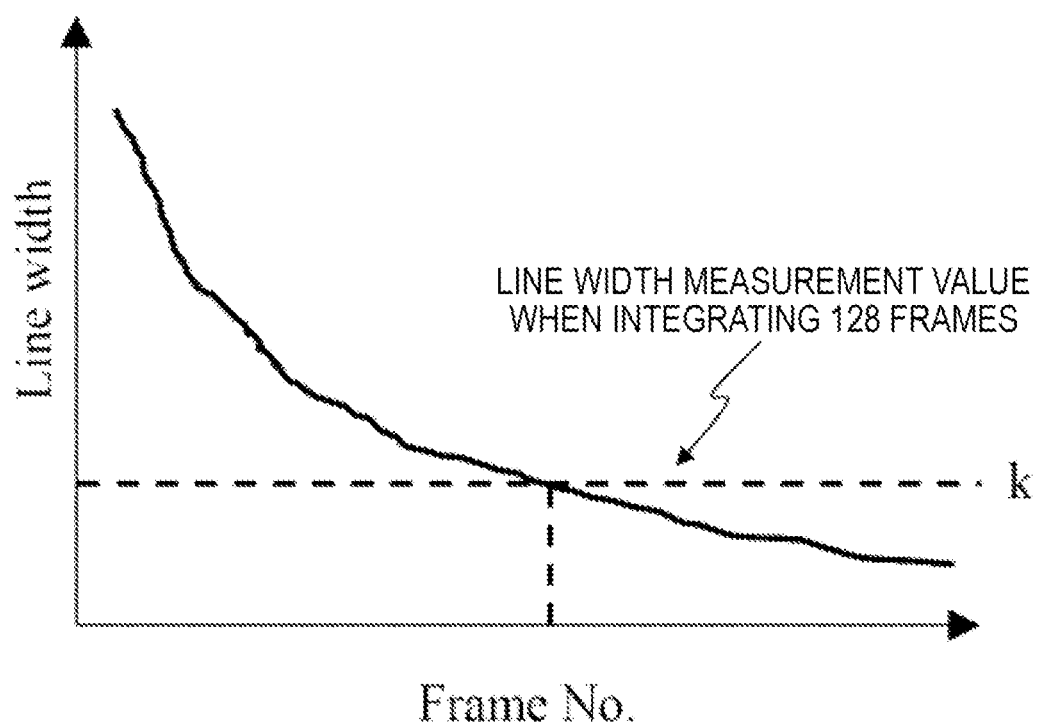

[FIG. 8]
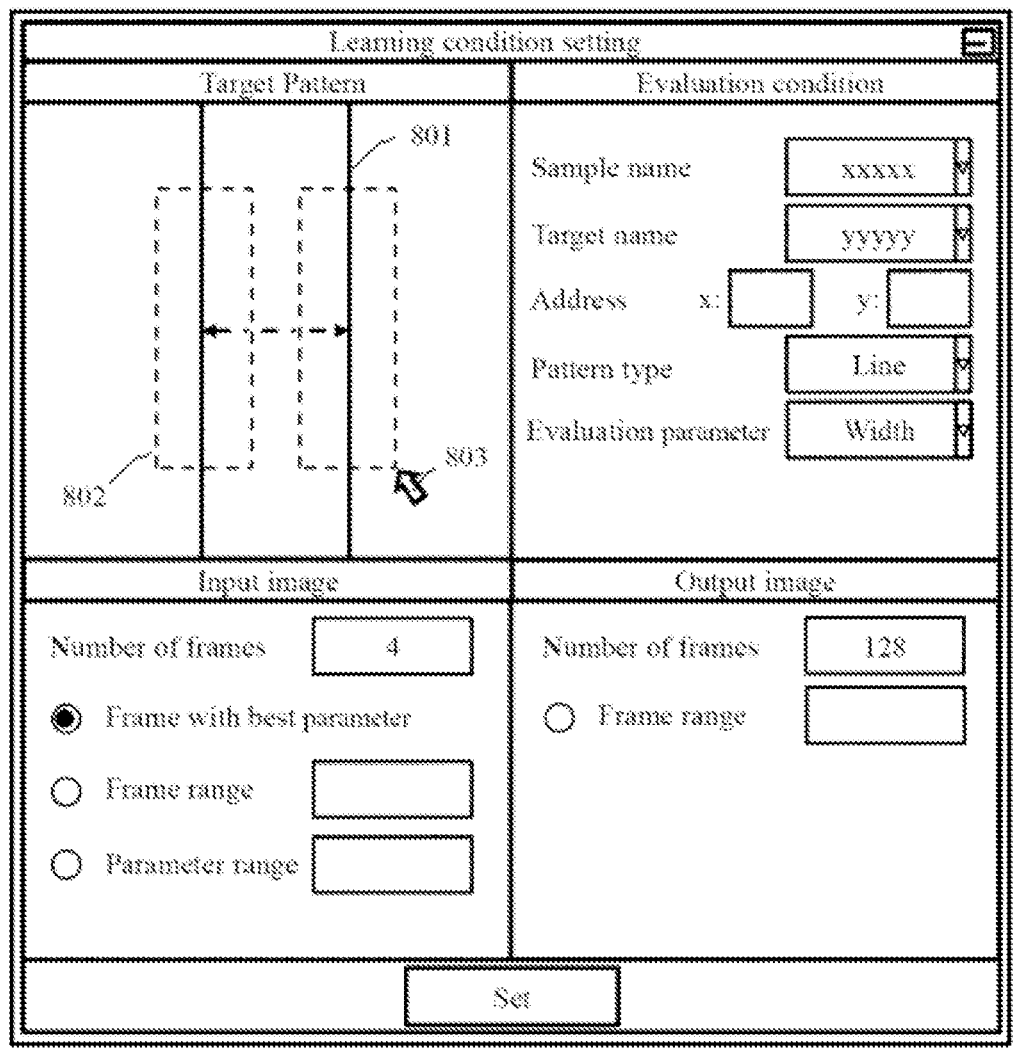

[FIG. 9]
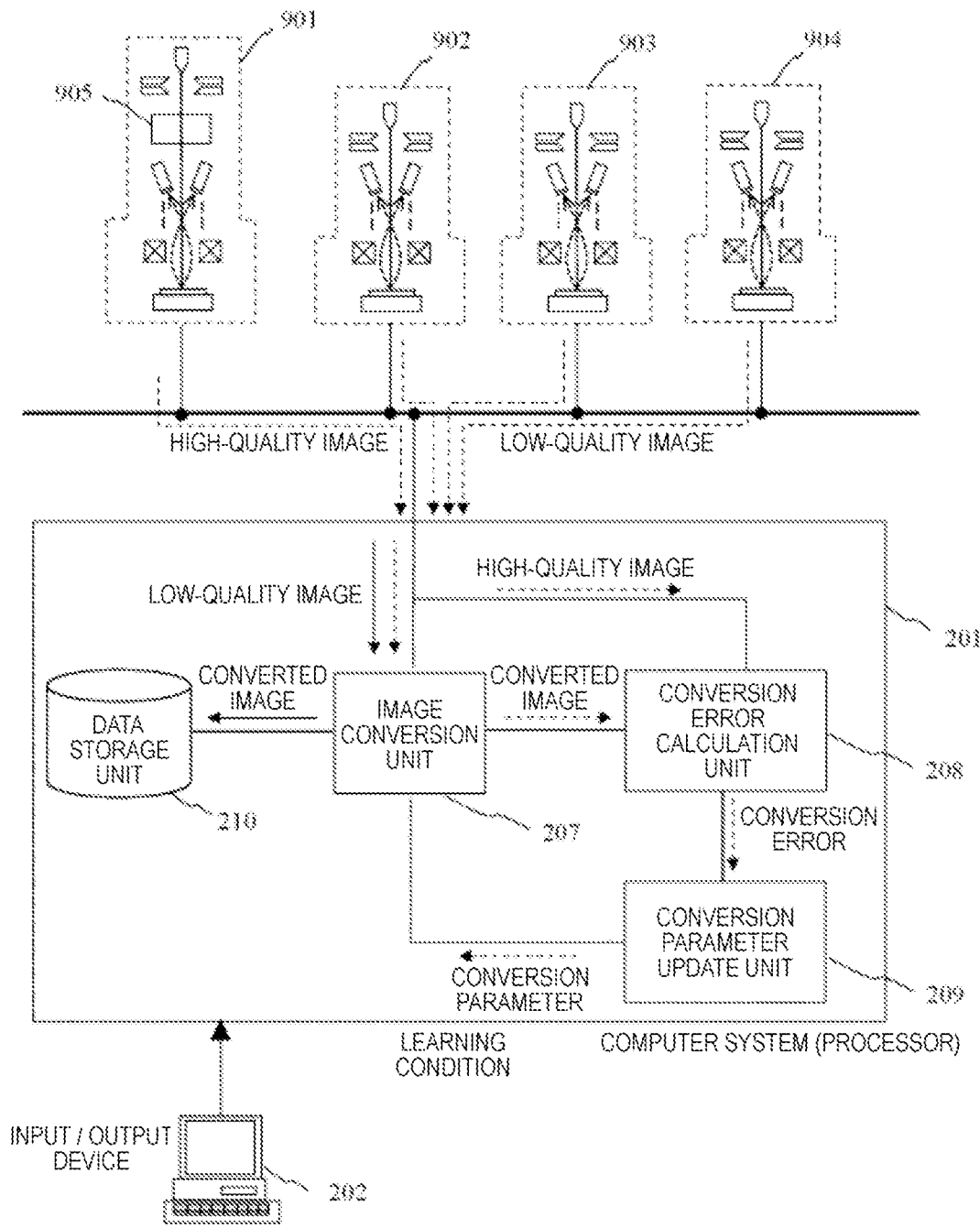

[FIG. 10]
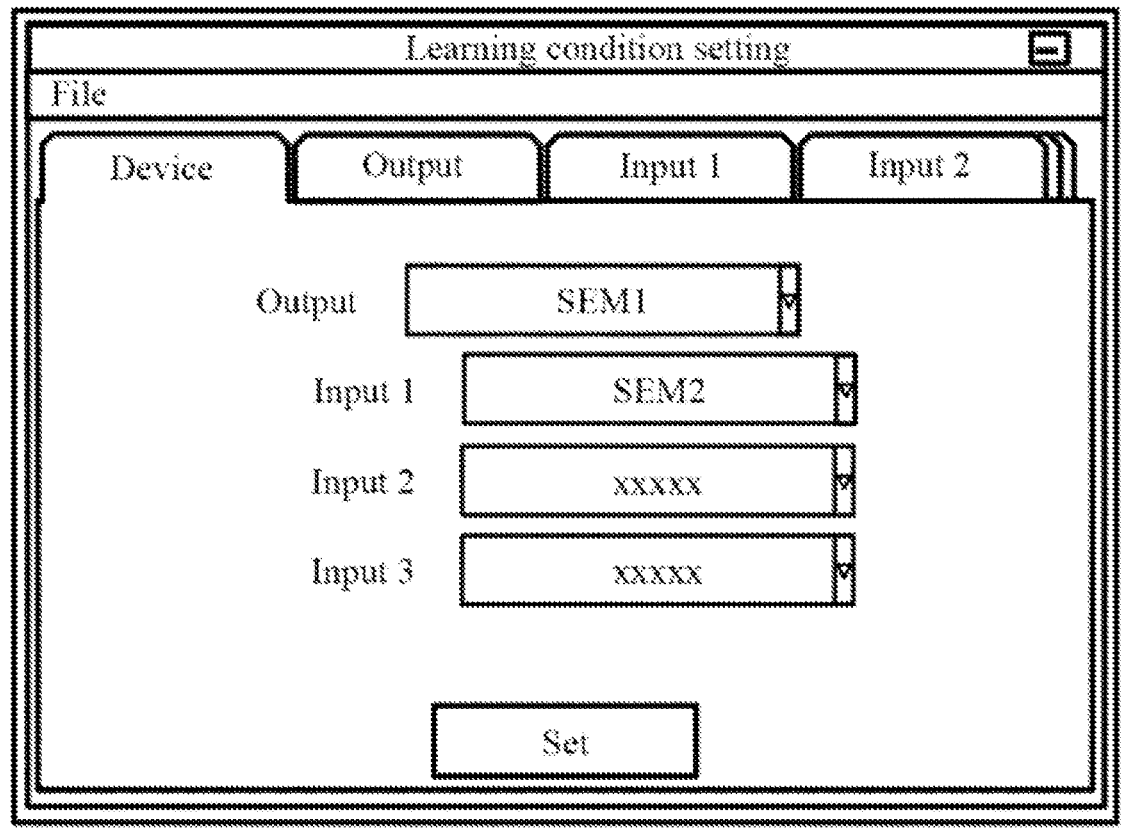

[FIG. 11]
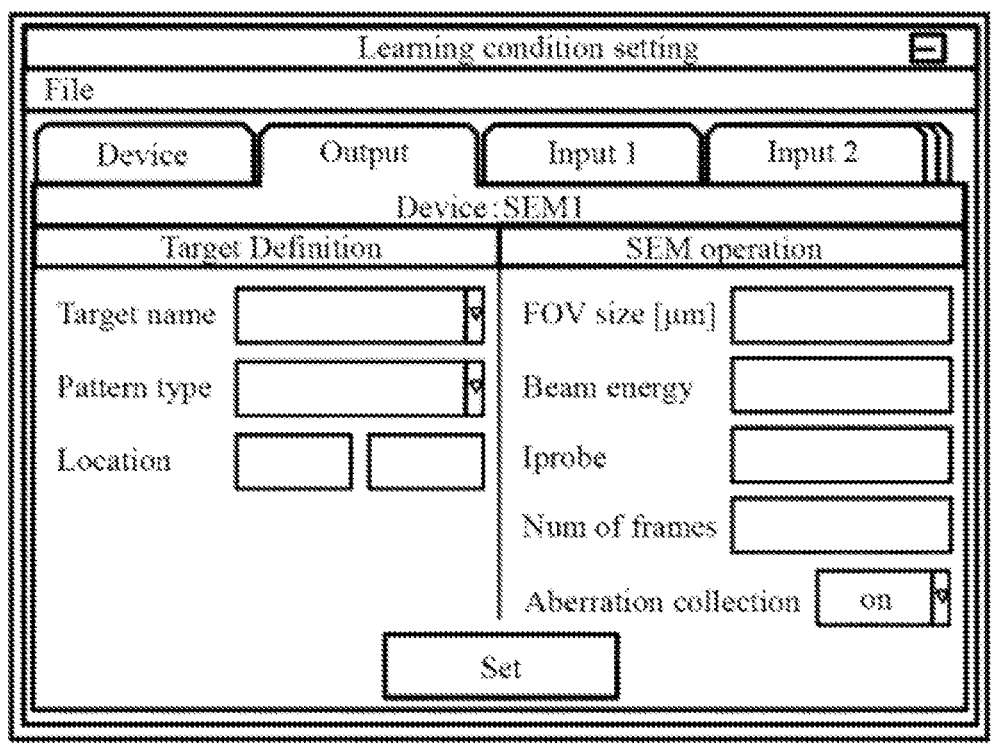

[FIG. 12]
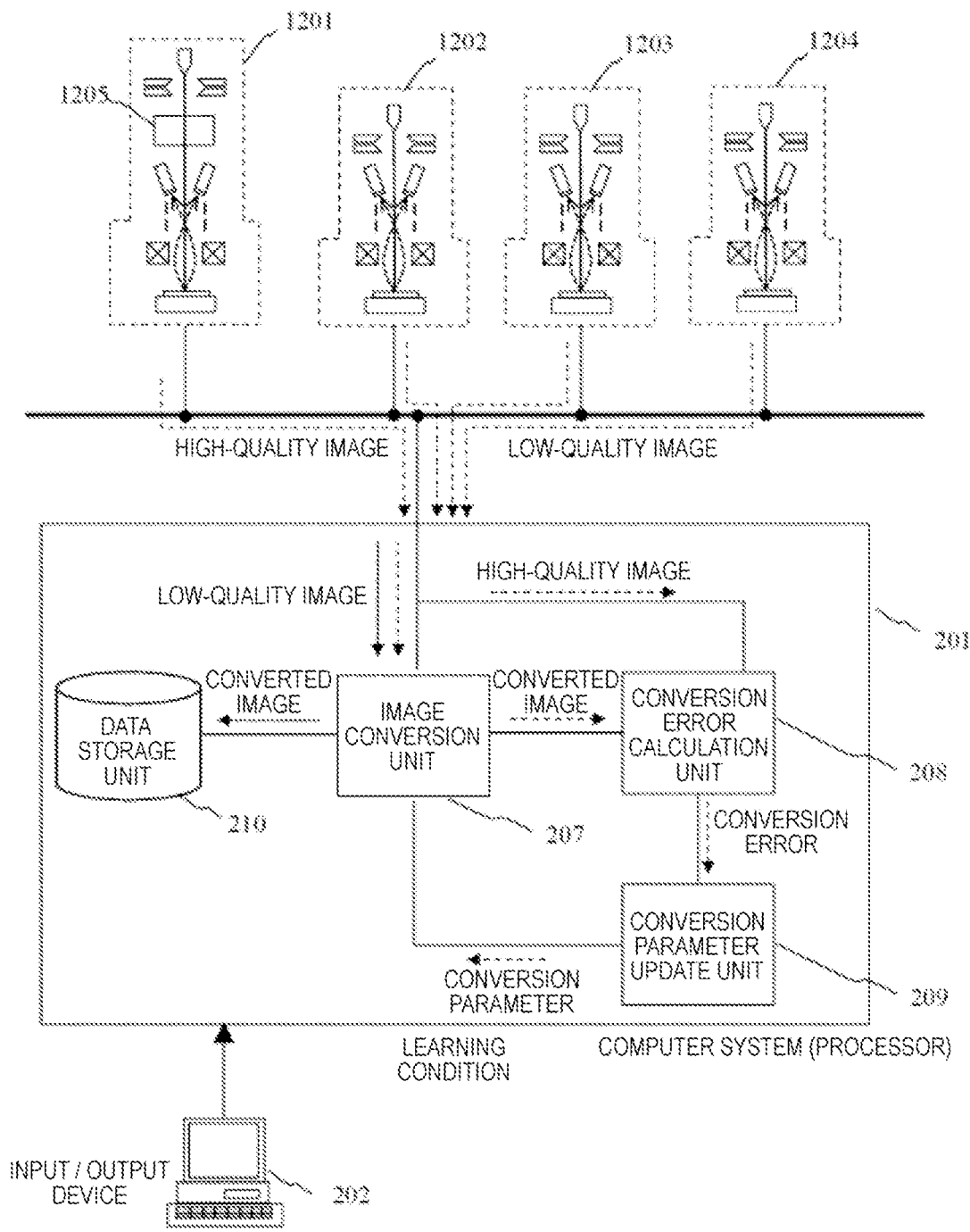

[FIG. 13]
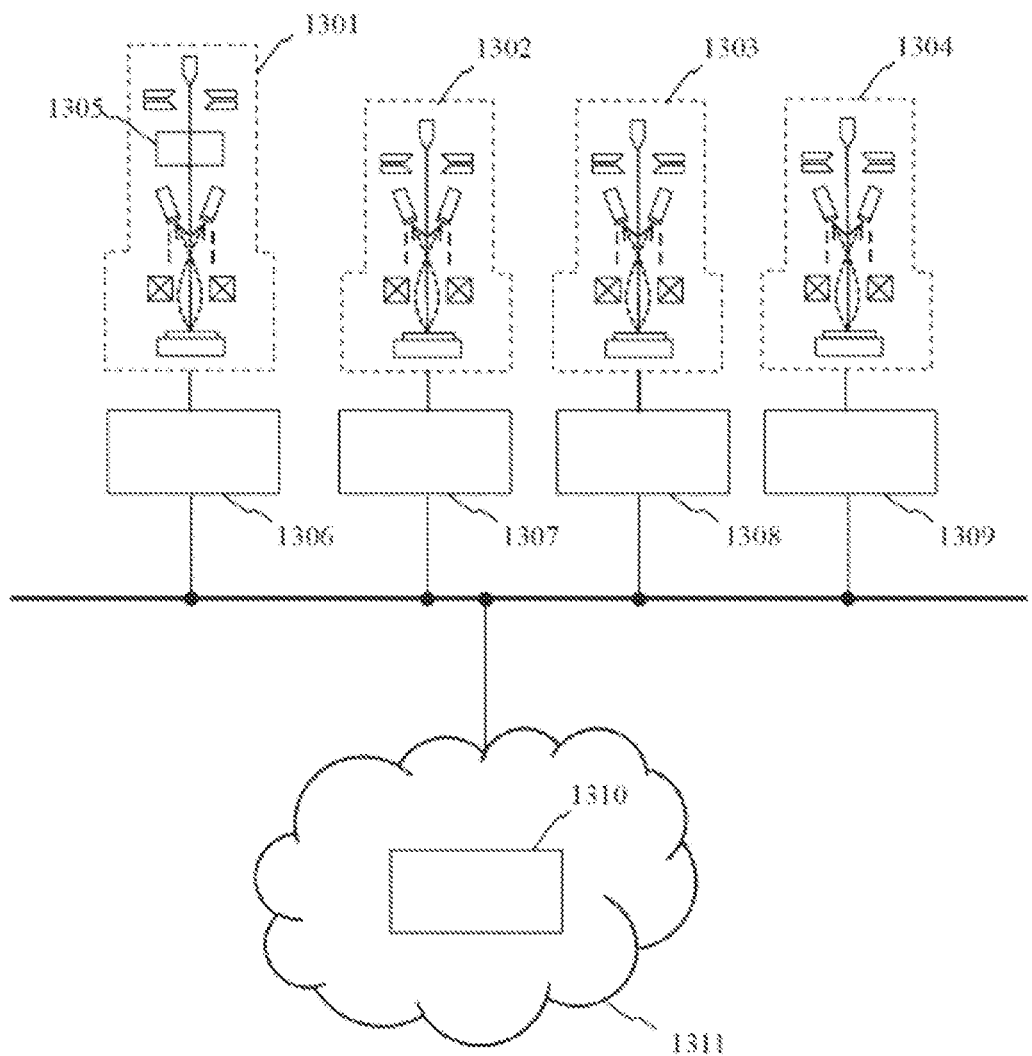

TRAINING METHOD FOR LEARNING APPARATUS, AND IMAGE GENERATION SYSTEM

TECHNICAL FIELD

The present disclosure relates to a training method for a learning apparatus that generates an image, a system, and a non-transitory computer-readable medium, and more particularly to a training method for a learning apparatus that generates an image based on irradiation of a sample with a beam, a system, and a non-transitory computer-readable medium.

BACKGROUND ART

When a sample such as a semiconductor wafer is irradiated with a charged particle beam such as an electron beam, a target (pattern) may shrink and a beam irradiation area may be charged. PTL 1 discloses a method of estimating a shape and a dimension before shrinkage of a pattern formed of a material that shrinks by irradiation with the charged particle beam. Further, PTL 2 discloses a method of estimating a high-quality image based on input of a low-quality image obtained by beam irradiation at a low dose in order to suppress shrinkage.

CITATION LIST

Patent Literature

PTL 1: JP5813413B (corresponding U.S. Pat. No. 9,830,524B)
PTL 2: JP6668278B (corresponding U.S. Pat. No. 10,559,074B)

SUMMARY OF INVENTION

Technical Problem

In the method disclosed in PTL 1, an image before the shrinkage can be estimated from an image after the shrinkage, but there is no disclosure of generating an image by suppressing shrinkage due to irradiation of the charged particle beam. In the method disclosed in PTL 2, a high-quality image can be estimated with beam irradiation at a low dose, but effects such as shrinkage that occur between the low-quality image and the high-quality image are not considered. Further, in the methods disclosed in PTL 1 and PTL 2, the effects of edge roughness of the pattern and a charging phenomenon caused by photographing using charged particles are not considered.

A training method that aims to perform learning using appropriate low-quality image and high-quality image, an image generation system that aims to perform appropriate learning on a learning apparatus, and a non-transitory computer-readable medium are described below.

Solution to Problem

As an aspect for achieving the above object, there is proposed a training method for a learning apparatus that generates a converted image based on input of an input image acquired by an image generation tool, including executing learning by inputting a first image generated under a first image generation condition and a second image generated under a second image generation condition different from the first image generation condition to the learning apparatus that adjusts parameters so as to suppress an error between the input image and the converted image one or more times, in which the second image is selected such that an index value extracted from the second image is the same as or has a predetermined relationship with an index value extracted from the first image, or the second image is output from a second image generation tool different from a first image generation tool for generating the first image.

Further, as another aspect for achieving the above object, there is proposed a system configured to generate a converted image based on input of an input image, including one or more computer subsystems that train a learning apparatus configured to generate a converted image based on the input of the input image and one or more components executed by the one or more computer subsystems, in which the one or more components executes learning by inputting a first image generated under a first image generation condition and a second image generated under a second image generation condition different from the first image generation condition to the learning apparatus that adjusts parameters so as to suppress an error between the input image and the converted image one or more times during learning from an input device, the second image is selected such that an index value extracted from the second image is the same as or has a predetermined relationship with an index value extracted from the first image, or the second image is output from a second image generation tool different from a first image generation tool for generating the first image, or a non-transitory computer-readable medium.

Advantageous Effects of Invention

According to the above configuration, it is possible to perform appropriate learning for a learning apparatus that estimates a high-quality image from a low-quality image, and appropriate image generation using the learning apparatus trained by the further appropriate learning.

BRIEF DESCRIPTION OF DRAWINGS

FIG. 1 is a diagram illustrating an example of a scanning electron microscope (SEM) which is a type of image generation tool.

FIG. 2 is a diagram illustrating an example of an image generation system including an image generation tool and a computer system that includes a learning apparatus.

FIG. 3 is a diagram illustrating an example of a system including a teacher data generation unit 304 that generates teacher data used for learning.

FIG. 4 is a diagram illustrating an example of a configuration of a neural network.

FIG. 5 is a diagram illustrating a relationship between an integrated image and an image to be integrated.

FIG. 6 is a flowchart for describing a learning process of the learning apparatus.

FIG. 7 is a graph illustrating a relationship between the number of frames and an index value (line width) during beam scanning.

FIG. 8 is a diagram illustrating an example of a GUI screen for inputting a learning condition of the learning apparatus.

FIG. 9 is a diagram illustrating an example of an image generation system including a plurality of image generation tools.

FIG. 10 is a diagram illustrating an example of a GUI screen for selecting the image generation tool that outputs an image provided for learning by the learning apparatus.

FIG. 11 is a diagram illustrating an example of a GUI screen for setting a device condition of the image generation tool that outputs an image provided for learning by the learning apparatus.

FIG. 12 is a diagram illustrating an example of an image generation system including a plurality of image generation tools.

FIG. 13 is a diagram illustrating an example of an image generation system including a plurality of image generation tools connected to a cloud server.

DESCRIPTION OF EMBODIMENTS

Embodiments of the present disclosure will be described below with reference to the accompanying drawings. In the accompanying drawings, functionally identical elements may be represented by the same number or corresponding number. Although the accompanying drawings illustrate embodiments and implementation examples in accordance with the principles of the present disclosure, they are for understanding the present disclosure and are in no way used to interpret the present disclosure in a limited manner. The description in this specification is merely a typical example and does not limit the scope of claims or applications of the present disclosure in any way.

Although the embodiments of the present disclosure are described in sufficient detail to enable those skilled in the art to embody the present disclosure, it is necessary to understand that other embodiments are possible and that changes in configuration and structure and replacement of various elements are possible without departing from the scope and spirit of the technical idea of the present disclosure. Therefore, the following description should not be construed as being limited to this.

In the embodiments described below, a method, system, and computer-readable medium for estimating a high-confidence image from a low-confidence image will be described in relation to a method, system, and computer readable medium for converting a first image into a second image.

Example 1

FIG. 1 is a diagram illustrating an example of a scanning electron microscope (SEM), which is a type of image generation tool that generates an image to be input to an image generation system according to a first embodiment. In the following description, the SEM, which is a type of charged particle beam device, will be described as the image generation tool, but is not limited to this, and, for example, a focused ion beam device that generates an image based on scanning of the ion beam can also be used as the image generation tool. Furthermore, alternatively, an image generation tool that can simplify processing or the like by generating a low-quality image rather than generating a high-quality image may also be used.

A scanning electron microscope system 100 illustrated in FIG. 1 includes an imaging unit 101 (scanning electron microscope body), a computer system 102, a signal processing unit 103, an input/output unit 104, and a storage unit 105. The storage unit 105 also functions as a non-temporary recording medium that stores a computer program that controls an operation of this system. The computer system 102 controls the following optical system provided in the imaging unit 101.

The imaging unit 101 includes an electron gun 106 that emits an electron beam 107, a focusing lens 108 that focuses the electron beam 107, and a focusing lens 109 that further focuses the electron beam 107 that has passed through the focusing lens 108. The imaging unit 101 further includes a deflector 110 that deflects the electron beam 107 and an objective lens 111 that controls a height at which the electron beam 107 is focused.

A sample 112 placed on a sample stage 113 is irradiated with the electron beam 107 that has passed through the optical system of the imaging unit 101. Emitted electrons 114 such as secondary electrons (SE) emitted from the sample 112 by the irradiation of the electron beam 107 and backscattered electrons (BSE) are detected by a lower detector 115 and an upper detector 116 installed on a trajectory thereof. An aperture provided in the upper detector 116 allows the electron beam 107 to pass through. By making this aperture sufficiently small, the secondary electrons emitted from the bottom of a deep hole and groove formed on the sample 112, passing through the vicinity of a pattern center, and escaping onto the sample surface can be detected. Energy of the emitted electrons 114 can be discriminated by energy filtering using an energy filter 117a immediately before the upper detector 116 or an energy filter 117b immediately before the lower detector 115.

The imaging unit 101 further includes a blanking deflector 118 that restricts the electron beam 107 from reaching the sample 112 by deflecting the electron beam 107 off an optical axis and a blanking electrode 119 that receives the electron beam 107 deflected by the blanking deflector 118.

The signal processing unit 103 generates an SEM image based on outputs of the lower detector 115 and the upper detector 116. The signal processing unit 103 generates image data by storing a detection signal in a frame memory or the like in synchronization with scanning by a scanning deflector (not illustrated). When storing the detection signal in the frame memory, a signal profile (one-dimensional information) and the SEM image (two-dimensional information) are generated by storing the detection signal in a position corresponding to a scanning position of the frame memory. Further, by deflecting the secondary electrons with a deflector 120 as necessary, the secondary electrons that have escaped from the deep hole or the like and pass through the vicinity of the optical axis can be guided outside the aperture of the lower detector 115 (detection surface of lower detector 115).

The signal processing unit 103 integrates image data obtained based on a plurality of times of two-dimensional scanning to a field of view. The image integration is a method of integrating and combining images for each frame by scanning and irradiating an observation area of the sample surface with the electron beam 107 a plurality of times repeatedly to increase the number of times the observation area is scanned with a primary electron beam (number of frames). According to this image integration, an amount of detection signal can be increased by simple integration in accordance with an increase in the number of frames while reducing noise by a cancellation effect by integrating and combining the images of each frame, and thus the S/N ratio can be improved. In the following examples, an example in which the image integration is performed mainly in units of FOV will be described, but is not limited to this. For example, a combined image may be generated by selectively integrating image data of a specific site or a region of interest (ROI) within the field of view.

FIG. 2 is a diagram illustrating an example of an image generation system including a scanning electron microscope system 100, which is a type of image generation tool, and a computer system 201 that generates an estimated image by receiving image data output from the scanning electron microscope system 100. The computer system 201 is configured with one or more computer subsystems including one or more CPUs and GPUs. The computer system 201 illustrated in FIG. 4 also includes one or more components executed by the one or more computer subsystems. One or more computer subsystems can implement processing described later by software using one or more processors, and may implement part or all of its processing by hardware such as an electronic circuit.

The computer system 201 is a learning apparatus that estimates a high-quality image based on input of an input image. The learning apparatus includes an image conversion unit 207 that converts an input image (second image, or low-quality image) to generate an estimated image (first image, or high-quality image). A conversion error calculation unit 208 calculates an error between a converted image (second image which is the output of the output layer) generated from the low-quality image by the image conversion unit 207 and an image (first image) input as correct answer data (high-quality image (teacher data)). More specifically, the conversion error calculation unit 208 calculates a mean absolute error, a mean square error, or the like as the conversion error from a pixel value of the converted image derived by forward propagation and a pixel value of a correct answer image corresponding thereto. A conversion parameter update unit 209 adjusts a conversion parameter (variable) of the neural network so as to suppress the conversion error of each pixel based on the conversion error, and supplies the conversion parameter to the image conversion unit 207.

Output accuracy can be improved by iterating forward propagation and back propagation as described above. Learning using images (teacher data) is performed until a weight for an input to neurons is optimized.

FIG. 3 is a diagram illustrating an example of a system including a teacher data generation unit 304 that generates teacher data used for learning by the learning apparatus. Data for learning or an original image for generating an estimated image is input from an input/output device 202 or another storage medium to the teacher data generation unit 304 via an input interface 303. Data for learning are, for example, high-quality image data, and low-quality image data selected by the computer system 102. The input image includes, for example, an image generated by an image generation tool, such as that illustrated in FIG. 1, based on beam scanning.

The computer system 201 illustrated in FIG. 3 includes a teacher data generation unit 304 that generates teacher data based on an input via the input interface 303 of the low-quality image data and the high-quality image data stored in a learning image data storage medium 301. The teacher data generation unit 304 generates teacher data based on a data set of the low-quality image and the high-quality image. The teacher data generated by the teacher data generation unit 304 is stored in a teacher data storage unit 305, and further input to a learning unit 306 that trains the learning apparatus. A learning model storage unit 307 stores a learning model generated by the learning unit 306.

An image estimation unit 308 uses the learning model generated by the learning unit 306 to estimate the high-quality image from the low-quality image.

The image estimation unit 308 uses an output image of the image generation tool such as that illustrated in FIG. 1 or an image (low-quality image) stored in a storage medium 302 as an input image, and generates an estimated image based on the input image. The image estimation unit 308 reads out the learning model whose estimation parameter has been adjusted by the learning unit 306 from the learning model storage unit 307, and executes image estimation using the learning model. The learning model is configured with, for example, the neural network, and includes one or more input layers, one or more middle layers (hidden layers), and one or more output layers as illustrated in FIG. 4.

The neural network performs learning for adjusting parameters (weight, bias, and the like) so that a desired result (for example, high-quality image, correct measurements, and the like) can be obtained at the output layer, thereby enabling proper output. Learning is performed by sequentially updating variables (weights and biases), for example, by error backward propagation method (back propagation), and an output error of data is subjected to partial differentiation by weight (including activation function), and the output is adjusted little by little to an optimum value. The learning model used by the image estimation unit 308 may not be stored in the learning model storage unit 307, but may be stored from a learning apparatus of another computer system.

The learning model described below is a learning apparatus (estimator) subjected to learning using a data set of high-quality image and low-quality image as teacher data. Further, the low-quality image is, for example, an image with fewer frames, an image obtained by beam irradiation with a small dose, an image acquired by a device with relatively low-performance, an image acquired in relatively poor conditions (for example, when the degree of vacuum in a vacuum chamber of a scanning electron microscope is low, state affected by degassing from sample, and the like), an image acquired at relatively low magnification (relatively wide field of view), an image obtained by relatively fast beam scanning, compared to the high-quality image, or an image acquired under a combination of the low-quality image conditions described above.

An image acquired with relatively few frames, low dose (low beam current), low magnification (relatively large field of view), or fast scanning (image generated under the second imaging condition) compared to the high-quality image generated in the first image generation condition has a low S/N ratio because the amount of beam irradiation per unit area thereof is relatively small. Meanwhile, if the amount of beam irradiation per unit area can be reduced, the shrinkage, charging, and irradiation time caused by beam irradiation can be suppressed. Further, there are cases where the image has to be acquired under worse conditions than the high-quality image.

In the following, an estimator for generating the high-quality image in a state free from effects such as shrinkage and charging will be described. In order to train such an estimator, for example, instead of simply using the data set of the high-quality image and the low-quality image as teacher data, a low-quality image, for which a relationship between at least one of a state of the high-quality image and a feature amount extracted from the high-quality image and at least one of a state of the low-quality image and a feature amount extracted from the low-quality image satisfies a predetermined condition, is selected, and a data set of the selected low-quality image and the high-quality image is used as teacher data. In this way, by using a data set in which the features of the low-quality image and high-quality image are approximated or matched as teacher data, it is possible to perform high-accuracy estimation of the high-quality image.

The training method of the learning apparatus and a high-quality image estimation method using the learning apparatus will be described more specifically below. In this embodiment, a learning model that can convert a few-frame image to a many-frame image with high accuracy when observing a sample whose pattern shrinks due to electron beam irradiation, and a system for performing learning on the learning model will be described.

In particular, image estimation processing using a learning apparatus, which has been trained by using teacher data that includes a data set of an integrated image (output) and images to be integrated (input), which are image data before integration, as a guide, will be described below. Further, during learning, learning is performed by selectively using an integrated image generated by integrating frames containing a shrank pattern and images to be integrated, which are affected by shrinking in the same manner as the integrated image and from which an index value (hereinafter, may also be referred to as a feature amount), which is the same as or has a predetermined relationship with an index value of the integrated image, is extracted. If such learning is possible, it is possible to generate a learning apparatus capable of estimating a many-frame image with minimized shrinkage based on the input of few-frame images obtained by scanning few frames (for example, one frame) at a level at which shrinkage does not become apparent.

FIG. 5 is a diagram illustrating the relationship between the integrated image and the images to be integrated. The integrated image is an image obtained by scanning the same field of view a plurality of times and integrating (adding and averaging) the obtained detection signals. An integrated image A in FIG. 5 is an image obtained by integrating Ni frames to Nn frames of images to be integrated. An image generation unit 203 in FIG. 2 generates an integrated image (combined image) by integrating a plurality of images to be integrated. Since the S/N of the image before integration is poor, the S/N is improved by performing integration processing. In order to improve the S/N, it is desirable to integrate the image signals of many frames, but on the other hand, if the beam is repeatedly scanned in the same place, the pattern may shrink or excessive charging may be accumulated. If an image obtained by scanning the many-frame can be estimated from an image signal obtained by scanning the few-frame, a high-quality image can be generated without shrinking the pattern or leaving charging on the sample.

An outline of a learning process for generating a learning model for generating the high-quality image will be described below. FIG. 6 is a flowchart illustrating the learning process of the learning model. The scanning electron microscope system 100 scans the electron beam 107 a plurality of times over a region on the sample where a desired measurement target or inspection object is located to generate a plurality of image signals (frame signals) (step 601). Here, in order to evaluate an image signal of each frame later, the image signal of each frame is stored in a frame memory or the like. Next, the image generation unit 203 integrates image signals of a plurality of frames to generate an integrated image (step 602).

Next, a dimension measurement unit 204 measures a dimension value of the pattern included in the image to be integrated and the integrated image stored in the frame memory or the like (step 603). The dimension value is obtained, for example, by generating a line profile illustrating luminance distribution in a specific direction and measuring the dimension between peaks included in the profile. Further, in this example, although the dimension value included in the image is described as the index value (feature amount), two-dimensional information such as an area value of the target (pattern formed on the sample, and the like) may be used as the index value instead of one-dimensional information such as the dimension value. Further, a pattern width, a space width between the patterns, a hole diameter, and the like can be considered for the dimension value. When measuring the area value, for example, an image is binarized and the number of pixels belonging to a specific pattern is counted. Further, the dimension value and the area value may be defined by the number of pixels or the like instead of a frequently used physical unit. As will be described later, as long as the value can be extracted from the high-quality image and the low-quality image and is comparable, it does not matter what type of value it is.

A determination unit 205 compares the index values of the plurality of images to be integrated and the integrated image measured by the dimension measurement unit 204, and selects the image to be integrated whose index value satisfies a predetermined condition (steps 604 and 605). The determination unit 205 selects, for example, an image to be integrated that has an index value that matches the index value of the integrated image. Further, an image to be integrated having an index value whose difference from the index value of the integrated image is equal to or less than a predetermined value may be selected. Furthermore, as will be described later, it may be selected from patterns that have been shrunk to some extent.

The computer system 201 generates a data set of the integrated image and the image to be integrated selected by the determination unit 205 and stored in a data storage unit 206, and trains the learning apparatus using this data set (steps 606 and 607).

In the learning model generated as described above, since the image to be integrated and the integrated image are not affected by shrinkage or the like, it is possible to estimate a high-quality image that is not affected by shrinkage or the like. Further, as described later, as the shrink progresses to some extent, an amount of variation in the feature amount tends to decrease. Therefore, if the number of frames and frame range where the effect of shrinking is small is known empirically, the data set of the image to be integrated and the integrated image in that frame or frame range may be used as teacher data.

FIG. 7 is a diagram illustrating an example of a graph illustrating a relationship between the number of frames and pattern dimensions. In this example, the relationship between a line width of the line pattern (vertical axis) and the number of frames (horizontal axis) is illustrated. The graph illustrated in FIG. 7 illustrates a state in which the line width gradually becomes thinner as the number of frames increases (cumulative irradiation dose increases). When 128 frames of images to be integrated are integrated to generate an integrated image, and the line width extracted from the integrated image is k, an image with the line width k (or an image to be integrated in which a line width close to k is output as a measurement value) is selected from among the images to be integrated, and a data set of the images to be integrated and the integrated image of 128 frames is used as teacher data.

When measuring the pattern dimensions displayed on the image to be integrated, for example, if the S/N ratio of a single frame image is low and accurate measurement results cannot be obtained, the integrated image, which is obtained by integrating the images to be integrated in the number of frames (for example, 4 frames), which is smaller than the number of integrations (for example, 128 frames) for generating the final integrated image but can improve the S/N ratio to some extent, may be used as the image to be integrated to output the measurement value. For example, when generating an integrated image of 128 frames, the integrated image of 128 frames may be generated and integrated images may be generated in units of 4 frames (1 to 4 frames, 5 to 8 frames, 9 to 12 frames, . . . ), and the measurement value of the image to be integrated may be extracted from these few-frame integrated images. By selecting appropriate data for learning from the few-frame images obtained at different timings, it is possible to generate an appropriate learning model.

Next, an example of a GUI screen for inputting conditions for generating such a learning model will be described. FIG. 8 is a diagram illustrating the example of the GUI screen. Such a GUI screen is displayed, for example, on a display screen of the input/output device 202 connected to the computer system 102, the computer system 201, or both the computer systems. If appropriate acquisition conditions for a few-frame image provided for learning can be set, it is possible to generate a learning model that can make appropriate estimation. Therefore, an example of mainly setting acquisition conditions for an input image (low-quality image) will be described using FIG. 8.

The GUI screen illustrated in FIG. 8 mainly includes an upper left column for displaying an image of the target pattern (target), an upper right column for setting selection conditions for the image provided for learning, a lower left column for setting generation conditions for the low-quality image, and a lower right column for setting acquisition conditions for the high-quality image. For example, in the upper left column, image data registered in advance or layout data of a target pattern are displayed. If the image to be integrated and the integrated image are acquired in advance, the images can be displayed in the upper left column and used for selecting a pattern edge and the like to be evaluated. In the example of FIG. 8, a line pattern is displayed, and a designation frame 802 for designating an edge to be evaluated of an edge 801 of the line pattern is displayed. The designation frame 802 is configured so that it can be set to any position and size within the image with a pointer 803 or the like.

In the upper right column, columns for setting a sample name, a target pattern name, the coordinates of a target pattern, a pattern type, and an evaluation parameter are provided. Based on the sample name, the target pattern name, or input of coordinate information, it may be configured to read already stored image data, or to generate device conditions (recipe) for an electron microscope, which is an image acquisition tool. Furthermore, it is desirable that an option for the pattern type includes patterns such as a line or a hole that configures a semiconductor device, and selection according to an imaging target is made possible. Further, in the evaluation parameter setting column, it is desirable that the setting of evaluation criteria for the target pattern, such as width (dimension) and area is made possible. In the example of FIG. 8, the line pattern is selected as the pattern type, and the line width is set as the evaluation parameter. Appropriate image estimation according to the purpose can be performed by performing setting according to inspection and measurement applications using images generated through image estimation.

In the lower left column of the GUI screen illustrated in FIG. 8, generation conditions for the low-quality image can be set, and the determination unit 205 generates learning data for the low-quality image based on the settings here. In the example of FIG. 8, it is possible to input the number of frames for image generation and selection conditions for frames used for image generation. In the example of FIG. 8, 4 is set as the number of frames required for low-quality image generation, and a condition for selecting a frame with the best evaluation parameter as data for learning is set. By performing such settings, the determination unit 205 selects, within the plurality of few-frame integrated images, the image whose parameter (line width in the example in FIG. 8) is closest to a final integrated image. In this example, the line width extracted from the final integrated image and the line width extracted from the plurality of few-frame integrated images are compared and the closest one is selected, but is not limited to this. For example, a few-frame integrated image for which an allowable range of the line width may be set and which has a line width, of which difference from the line width extracted from the final integrated image is equal to or less than a predetermined value, may be selected. Further, if an appropriate line width is not measured, it may be determined not to generate teacher data. Furthermore, if the frame range from which the dimension value equivalent to that of the final integrated image is obtained is known empirically, that frame range may be selected. Furthermore, the teacher data may be generated only when the line widths match, and teacher data may be generated from a plurality of few-frame integrated images whose difference described above is equal to or less than the predetermined value, and the integrated image. It is desirable that the number of frames for the low-quality image can be set to 1 or more and less than the number of frames required for generating the high-quality image.

The lower right column of the GUI screen illustrated in FIG. 8 is a setting column for setting acquisition conditions for the high-quality image (output) that configures a part of teacher data. In the example of FIG. 8, the number of frames required for high-quality image generation is set to 128. Further, instead of designating the total number of frames, the range of frames required for image generation may be set.

For example, the computer system 102 executes integrated image generation, evaluation of the feature amount such as the line width, selection of the image based on feature amount evaluation, and generation of teacher data, based on the settings on the GUI screen as illustrated in FIG. 8.

By inputting a few-frame image (one frame image or image with fewer number of frame integrations than high-quality image) to the computer system 201 including the learning apparatus trained as described above, it is possible to estimate a many-frame image (high-quality image).

By performing learning (one or more times of iterations of forward propagation and back propagation) using the data set of the high-quality image and the low-quality image, which matches or approximates conditions such as shrinkage to the high-quality image and from which an index value that is the same as or has a predetermined relationship with the index value of the high-quality image, is extracted as described above, it is possible to highly accurately estimate the many-frame image from the few-frame image with suppressed shrinkage.

Further, in the first embodiment described above, although a sample in which the pattern shrinks due to electron beam irradiation was described as an example, it is possible to similarly estimate the many-frame image with high accuracy from the few-frame image even in a sample whose pattern does not shrink by electron beam irradiation or whose degree of shrinkage does not affect a targeted index value.

If the many-frame image can be highly accurately estimated from the few-frame image, the many-frame image can be obtained with a small number of times of imaging, and thus the throughput of many-frame image generation is improved. By using the integrated image and the frame image of the K-th frame that matches a length measurement value of the integrated image as the teacher data set, it is possible to similarly generate a data set of teacher data that matches or approximates the conditions even in the sample whose pattern does not shrink by electron beam irradiation or whose degree of shrinkage does not affect the targeted index value.

By performing learning (one or more times of iterations of forward propagation and back propagation) using the data set of the high-quality image and the low-quality image, from which an index value that is the same as or has a predetermined relationship with the index value of the high-quality image, is extracted as described above, it is possible to generate a many-frame image that can be estimated with high accuracy from the few-frame image.

Defect detection, observation of detected defects, classification, circuit pattern measurement, and the like may be embodied using the high-quality image estimated by the method described above.

Example 2

In this example, a high-quality image (first image) is generated with a high-performance image acquisition tool, a low-quality image (second image) is generated with an image acquisition tool having relatively poor performance relative to the high-performance image acquisition tool, and a learning apparatus subjected to learning using a data set of both the images as teacher data will be described. In this example, a training method in which images under different image generation conditions are generated by two or more devices having different performances and the plurality of images are used as teacher data will be described. FIG. 9 is a diagram illustrating an example of an image generation system including a high-performance image acquisition tool 901 and low-performance image acquisition tools 902 to 904. The high-performance image acquisition tool 901 is, for example, a scanning electron microscope equipped with an aberration corrector 905, and the low-performance image acquisition tool is a scanning electron microscope not equipped with the aberration corrector 905.

The aberration corrector 905 includes an optical element that suppresses aberration, such as a multipole structure or an electronic mirror, and a device with the aberration corrector 905 can generate a relatively high resolution image compared to a device without the aberration corrector 905. On the other hand, the device with the aberration corrector 905 is expensive compared to the device without the aberration corrector. If an image acquired by an expensive device can be estimated from an image acquired by a relatively inexpensive device, it is possible to construct an inexpensive system using a plurality of image acquisition tools for measuring and inspecting a large number of samples, for example, for semiconductor yield management.

In the system illustrated in FIG. 9, for example, the same sample, or the same sample in terms of design data is acquired by the high-performance image acquisition tool 901 and the low-performance image acquisition tools 902 to 904, respectively, and the learning apparatus included in the computer system 201 is trained using a data set of the acquired samples as teacher data.

By inputting the image obtained by the low-performance image acquisition tool to the learning apparatus trained as described above, it is possible to estimate the image obtained by the high-performance image acquisition tool. Further, when there is one high-performance device and a plurality of low-performance devices, by preparing a learning apparatus for each low-performance device, it is possible to reduce a machine difference between the low-performance devices.

In the example described above, an example in which teacher data is generated by using the device equipped with the aberration corrector as the high-performance device has been described, but is not limited to this. For example, a device that can emit a relatively high-energy beam compared to the low-performance device may be used as the high-performance device. For example, an electron microscope can obtain a high-resolution image when the energy of the beam to be emitted is higher. Therefore, a device that can emit a beam at a higher acceleration may be used as the high-performance device, and a data set of an image obtained based on beam irradiation with high acceleration energy, which cannot be done with the low-performance device, and an image obtained with the low-performance device may be used as teacher data.

Further, even a device with a high degree of vacuum in a sample chamber or a device that can emit a large current beam may be used as the high-performance device that can obtain a relatively high-quality image compared to a device that can realize only a relatively low-vacuum environment or a device that can emit only a small current beam. Further, even if the high-performance device cannot fully demonstrate its performance due to the environment, teacher data may be created by using an image obtained in a good environment as the high-quality image.

FIGS. 10 and 11 are diagrams illustrating examples of GUI screens for setting generation conditions for teacher data for learning from image data and the like output from the high-performance device and the low-performance device. The GUI screens illustrated in FIGS. 10 and 11 are displayed on the display device or the like of the input/output device 202 connected to the computer system 201. FIGS. 10 and 11 illustrate GUI screens that can be switched to a screen for selecting a device that generates image data or selecting image generation conditions for an image generation tool by selecting a tag. FIG. 10 illustrates a selection screen for selecting the device that generates image data. For example, if a device that outputs a high-quality image to be estimated (for example, high-performance image acquisition tool 901) is selected as an output device and a device that outputs a low-quality image (for example, low-performance image acquisition tools 902 to 904) is selected as an input device, the computer system 201 trains the learning apparatus by teacher data including a data set with the low-quality images as input and the high-quality image as output.

FIG. 11 is an example of a GUI screen for setting image acquisition conditions for the selected image acquisition tool. The left column is a setting column for setting, for example, a sample targeted for image generation, pattern information, and coordinate information of a pattern. The right column is a setting column for setting image generation conditions of the image generation tool. When the image generation tool is an electron microscope, the image generation conditions are optical conditions such as the field of view size (or magnification), the energy of the beam irradiated onto the sample, the beam current, and the number of frames. Furthermore, in the example of FIG. 11, a selection field for operating the aberration corrector is provided.

As described above, it is possible to generate a learning apparatus according to the purpose by providing the setting field in which any input device and output device can be set. Further, since it is desirable that the sample targeted for image generation is the same or substantially the same, by making it possible to copy sample information between a plurality of devices, the trouble of setting can be reduced. Furthermore, by making it possible to set device conditions unique to each device, any high-quality image and low-quality image can be generated.

Further, for example, a master device, which is an image acquisition tool to be used as a reference, may generate the many-frame image, other devices may generate the few-frame image, and the data set of the many-frame image and the few-frame image may be used as teacher data. By performing image generation using a plurality of learning models generated based on such teacher data, it is possible to estimate the high-quality image using the low-quality image with no machine difference.

Example 3

In the examples described above, although the learning apparatus trained by using the images obtained mainly under different beam irradiation conditions as the high-quality image and the low-quality image was exemplified, in this example, the high-quality image and the low-quality image are acquired by changing conditions such as detection conditions for charged particles obtained based on beam irradiation to the sample, signal processing conditions for detector output, and image processing conditions, and a learning apparatus trained by using these images as teacher data will be described.

In the case of the electron microscope equipped with a plurality of detectors as illustrated in FIG. 1, images generated based on respective detector outputs differ depending on the types, arrangement conditions, and the like of the detectors. For example, the upper detector 116 and the lower detector 115 illustrated in FIG. 1 detect electrons emitted from the sample toward different elevation angle ranges. For example, the upper detector 116 detects electrons emitted in an angle range of elevation angles $\alpha_1$ to $\alpha_2$, and the lower detector 115 detects electrons emitted in the angle range of elevation angles $\alpha_3$ to $\alpha_4$ ($\alpha_1 > \alpha_2 > \alpha_3 > \alpha_4$).

For example, if there is a contact hole or groove in a scanning region of the electron microscope, the upper detector 116 has a higher ratio of electrons emitted from the hole bottom and the groove bottom contained in all detected electrons compared to the lower detector 115. That is, when a measurement target is the contact hole bottom, the image generated based on the output of the upper detector 116 becomes a clearer image of the bottom of the hole than the image generated based on the output of the lower detector 115, and in view of the purpose of measurement, the image generated based on the output of the upper detector 116 becomes the high-quality image.

For example, according to the learning apparatus using a set of image data output from the electron microscope equipped with only a detector corresponding to the upper detector 116 and image data output from an electron microscope equipped with only a detector corresponding to the lower detector 115 as teacher data, it is possible to estimate an image output by a device having the detector corresponding to the upper detector 116 from an image output from a device that does not have the detector corresponding to the upper detector 116.

Further, the learning apparatus may be trained by using image data output by a device having performance difference of the detector itself. For example, in the case of a detector equipped with a scintillator on a detection surface of electrons and a light guide that guides light generated by electrons colliding with the scintillator to a photomultiplier tube, a difference in image quality of the image generated based on the detector output may occur depending on performance of the scintillator. More specifically, even when electrons collide with the scintillator under the same conditions, the same image cannot be obtained if there is a difference in conversion characteristics (degree of luminescence, afterglow characteristics, and the like) of the scintillator. Therefore, by training the learning apparatus using the image generated based on the output of the detector having a scintillator with excellent conversion characteristics as the high-quality image and using the image generated based on the output of a detector having a scintillator with relatively poor conversion characteristics as the low-quality image and by inputting the low-quality image to the trained learning apparatus, it is possible to estimate the high-quality image even from the low-quality image. Further, the light guide also has different light transmission characteristics depending on its type. Therefore, the learning apparatus may be trained by using an image output from a device having the light guide with excellent light transmission characteristics as the high-quality image and using an image output from a device having a light guide with inferior light transmission characteristics as the low-quality image. Further, since image quality is not determined by the performance of one optical element, but is determined by complex conditions such as a structure of the detection element and image processing conditions, an image having excellent output image quality may be selected as the high-quality image.

Furthermore, the learning apparatus may be trained by using an image output from a device having a larger number of detectors as the high-quality image and an image output from a device having a relatively small number of detectors as the low-quality image. In the case of this example, since the device having the larger number of detectors covers a wider range of the trajectories of electrons emitted from the sample and can detect more electrons, it is used as the high-quality image, but, even if the number of detectors is the same or less than that, the image generated based on the output of the device with a larger range that can be covered may be used as the high-quality image. Further, a combined image obtained by combining the outputs of a plurality of detectors may be used as the high-quality image.

For example, if detectors are arranged in a plurality of different directions (a plurality of azimuth directions) perpendicular to a beam optical axis and outputs of the plurality of detectors are combined, it is possible to generate an image reflecting height information of a target such as a pattern or a foreign object. By training the learning apparatus by using such an image as the high-quality image and using an image generated based on the outputs of fewer detectors than the number of detectors used to generate the high-quality image or an image generated based on the output of the detector having poor performance as the low-quality image, it is possible to generate the high-quality image reflecting the height information based on input of the low-quality image.

Furthermore, an image generated based on special detection conditions can also be used as the high-quality image. For example, the scanning electron microscope as illustrated in FIG. 1 is provided with the energy filter 117. The energy filter 117 includes, for example, three layers of mesh-like electrodes, and has a structure in which a central mesh electrode to which a negative voltage is applied is sandwiched between two mesh electrodes at ground potential. An energy filter is a high pass filter that restricts the passage of electrons having low energy by adjusting the applied negative voltage. By using such an energy filter, electrons having high energy can be selectively detected. By using the energy filter, an image in which, for example, specific composition or unevenness information is emphasized, can be generated. An image in which such specific information is emphasized can be used as the high-quality image, and an image acquired under other conditions can be used as the low-quality image.

Further, an image output from a device equipped with an energy analyzer may be used as the high-quality image. The energy analyzer is a bandpass filter, and can selectively pass electrons in a particular energy range.

By using the energy filter and the energy analyzer, it is possible to selectively detect electrons having specific energy, while other electrons are filtered, and thus an amount of detection is reduced. For example, the high-quality image is generated by integrating a plurality of frames (m frames) of image data generated based on the electrons selected by the energy filter. On the other hand, the learning apparatus may be trained by using a few-frame integrated image (o frames: m>o) that is not subjected to energy filtering as the low-quality image.

As the methods of detecting electrons using the electron microscope, there are a direct detection method in which the detection surface of the detector such as the scintillator is placed on the trajectory of electrons emitted from the sample and a detection method in which a metal plate (reflecting plate) is placed on the trajectory of electrons, and electrons (tertiary electrons) generated when the electrons collide with the reflecting plate are drawn into the detector and detected. In the case of the detection method using the reflecting plate, electrons that finally reach the detector are caused by collisions of secondary electrons and the like with the reflecting plate. Therefore, when performing a composition analysis using the electron microscope and the like, information of the reflecting plate is mixed. Therefore, the learning apparatus is trained by using the image generated based on the output of a direct detector as the high-quality image and using the image generated based on the output of the device provided with the reflecting plate as the low-quality image. By inputting the low-quality image to the learning apparatus that has been subjected to such learning, it is possible to estimate the image generated based on the output of the direct detector.

Example 4

In this example, as an example of the training method in which the images under different image generation conditions are generated by two or more devices having different performances described in Example 1 or Example 2 and the plurality of images are used as teacher data, images of electron beams and the like are generated by image acquisition tools having different imaging depths of focus (DoF) and resolutions, and a learning apparatus trained by using the plurality of images as teacher data will be described.

FIG. 12 is a diagram illustrating an example of an image generation system including an image acquisition tool 1201 having shallow DoF but high resolution and image acquisition tools 1202 to 1204 having deep DoF but lower resolution relative to the image acquisition tool 1201. The image acquisition tool 1201 is, for example, the scanning electron microscope equipped with an aberration corrector 1205, and the image acquisition tools 1202 to 1004 are scanning electron microscopes not equipped with the aberration corrector 1205.

In the system illustrated in FIG. 12, for example, the same sample, or the same sample in terms of design data is acquired by the image acquisition tool 1201 having shallow DoF but high resolution and the image acquisition tools 1202 to 1204 having deep DoF but low resolution, respectively, and the learning apparatus included in the computer system 201 is trained using a data set of the acquired samples as teacher data.

By inputting the image obtained by the image acquisition tool having deep DoF but low resolution to the learning apparatus trained as described above, it is possible to estimate an image having deep DoF and high resolution. Further, when there is one image acquisition tool having shallow DoF but high resolution and a plurality of image acquisition tools having deep DoF but low resolution, by preparing a learning apparatus for each image acquisition tool having deep DoF but low resolution, it is possible to reduce the machine difference between the image acquisition tools having deep DoF but low resolution.

In the example described above, an example in which teacher data is generated by using the image acquisition tool having shallow DoF but high resolution and equipped with the aberration corrector as the high-performance device has been described, but is not limited to this.

Next, an example of a sample having a two-dimensional pattern formed of Si (Si sample) for generating such a learning model and a training method using the sample will be described. The Si sample is formed of a conductive material, and the deterioration of image quality due to charge-up of the sample is small in photographing with the scanning electron microscope, and the pattern is formed at a predetermined height.

Here, a method of training the learning apparatus that generates a high-resolution, deep depth of focus image from low-resolution, deep-focus images photographed with a scanning electron microscope not equipped with an aberration corrector using a Si sample will be described, but is not limited to this, and patterns of other shapes, for example, may be used.

If the pattern height of the Si sample is lower than DoF corresponding to photographing conditions of the scanning electron microscope provided with aberration correction, in the image generated from the scanning electron microscope having low DoF but high resolution and provided with aberration correction, there is no reduction of resolution due to lack of depth of focus or charge-up. On the other hand, if the pattern height of the Si sample is higher than the DoF corresponding to photographing conditions of a scanning electron microscope having shallow DoF but high resolution and provided with the aberration corrector, the resolution is reduced.

Therefore, the Si sample is acquired by the scanning electron microscope having shallow DoF but high resolution and a scanning electron microscope having deep DoF but low resolution, respectively, and the learning apparatus included in the computer system 201 is trained by using the data set of the images as teacher data.

By inputting the image obtained by the deep DoF but low resolution scanning electron microscope to the learning apparatus trained as described above, it is possible to estimate the image having deep DoF and high resolution.

Further, it is possible to output an image having high resolution and less damage on a sample that cannot withstand charging caused by photographing.

Example 5

In this example, as an example of the training method described in Example 1 or Example 2, the images are generated by image acquisition tools with different energy and resolutions of electron beams and the like, and a learning apparatus trained by using a data set consisting of the plurality of images and spatial frequency information, for example, power spectral density (PSD), extracted from the images as teacher data will be described.

As the scale-down of semiconductor devices progresses, an allowable margin for dimensional variation of fine patterns in a manufacturing process of the device is becoming smaller. For example, it is required to detect slight line edge roughness (LER) or line width roughness (LWR) generated in a fine line pattern with high sensitivity. Especially, in measurement of the fine pattern formed with resist, since the resist material is destroyed and shrunk due to electron beam irradiation during photographing, it is difficult to accurately measure original roughness information of the formed pattern. As an example of reducing shrinkage, it is necessary to image under low-energy beam conditions. Further, as an example of accurately measuring original measurement information, it is necessary to image with the scanning electron microscope provided with an aberration corrector in order to generate a high-resolution image. Furthermore, it is necessary to extract spatial frequency information that reflects minute roughness information of line patterns with higher sensitivity and higher accuracy.

Therefore, a training method for a learning apparatus, which can measure the line edge roughness or line width roughness of a line pattern from an image photographed using a high energy beam with high sensitivity in the same way as an image photographed using a low-energy beam by the scanning electron microscope equipped with the aberration corrector, by using the line pattern, for which at least one value of a frequency component and an amplitude is known, in acquiring image data for learning prepared for training the learning apparatus, will be described.

Although a method of training the learning apparatus using the sample on which the line pattern is formed will be described, but is not limited to this, and patterns of other shapes, for example, may be used.

A line pattern of which at least one of the frequency component and the amplitude has a predetermined value is used in acquiring the image data for learning prepared for training the learning apparatus. It is conceivable that, for example, undulation information or the like is built into the line pattern so that at least one of the frequency component and the amplitude has a predetermined value. It is conceivable that the image acquisition tool used in acquiring the image data for learning is, for example, a combination of the scanning electron microscope provided with the aberration corrector and capable of imaging under low-energy beam conditions and the scanning electron microscope not provided with the aberration corrector and capable of imaging under high-energy beam conditions. An image photographed by the scanning electron microscope provided with the aberration corrector and capable of imaging under low-energy beam conditions has high resolution and small shrinkage, and an image close to the original edge shape of the line is acquired. On the other hand, an image photographed by the scanning electron microscope not provided with the aberration corrector and capable of imaging under high-energy beam conditions has relatively low resolution and large shrinkage, and becomes an image having a large deviation from the original edge shape of the line. Spatial frequency information such as PSD using techniques such as spatial frequency analysis is extracted from the plurality of images, and the learning apparatus included in the computer system 201 is trained by using the plurality of images and the spatial frequency information of the image or sample as teacher data.

By inputting the image obtained by the scanning electron microscope not provided with the aberration corrector and capable of imaging under high-energy beam conditions to the learning apparatus trained as described above, it is possible to estimate an image having high resolution and small shrinkage and close to the original edge shape of the line or estimate spatial frequency information that reflects minute roughness information of the line pattern.

Example 6

In this example, as an example of the training method described in Example 2, a high-performance image acquisition tool and a low-performance image acquisition tool provided with a computer system are connected to a cloud server, and a method of training a learning apparatus will be described.

FIG. 13 is a diagram illustrating an example of an image generation system including a plurality of image generation tools connected to a cloud server 1311. In the system illustrated in FIG. 13, a high-performance image acquisition tool 1301 is, for example, a scanning electron microscope equipped with an aberration corrector 1305, and the low-performance image acquisition tool is a scanning electron microscope not equipped with the aberration corrector 1305.

The high-performance image acquisition tool 1301 and low-performance image acquisition tools 1302 to 1304 include computer systems 1306 to 1309 and are connected to a computer system 1310. For example, the same sample or the same sample in terms of design data is acquired by the high-performance image acquisition tool 1301 and the low-performance image acquisition tools 1302 to 1304, respectively, a teacher data set consisting of a set of images acquired by the plurality of image acquisition tools is generated, the teacher data set is transferred (uploaded) to the computer system 1310, and the learning apparatus included in the computer system 1310 is trained by the cloud server.

The learning apparatus trained as described above is transferred to the computer systems 1306 to 1309, and can estimate the image obtained by the high-performance image acquisition tool by receiving the images obtained by the low-performance image acquisition tools.

Here, an example of transferring the images acquired by the respective low-performance image acquisition tools 1302 to 1304 to the computer system 1310 has been described, but is not limited to this, and estimated images generated by the computer systems 1306 to 1309 may be used.

Further, by using the high-performance image acquisition tool as a master machine, which is an image acquisition tool to be a standard, and preparing a learning model for each of the low-performance image acquisition tools, it is possible to reduce the machine difference between the low-performance image acquisition tools. The learning model is transferred from the low-performance image acquisition tool to the computer system 1310, and the learning model updated in the computer system 1310 may be used.

REFERENCE SIGNS LIST

100: scanning electron microscope system
101: imaging unit
102: computer system
201: computer system
202: input/output device
203: image generation unit
204: dimension measurement unit
205: determination unit
206: data storage unit
207: image conversion unit
208: conversion error calculation unit
209: conversion parameter update unit
210: data storage unit

The invention claimed is:

1. A training method for a learning apparatus that generates a converted image based on input of an input image acquired by an image generation tool, comprising:
executing learning by inputting a first image generated under a first image generation condition and a second image generated under a second image generation condition different from the first image generation condition to the learning apparatus that adjusts parameters so as to suppress an error between the input image and the converted image one or more times, wherein
the second image is selected such that an index value extracted from the second image is the same as or has a predetermined relationship with an index value extracted from the first image, or
the second image is output from a second image generation tool different from a first image generation tool for generating the first image.

2. The training method according to claim 1, wherein the first image is of higher quality than the second image.

3. The training method according to claim 1, wherein the image generation tool is a charged particle beam device, and the first image is acquired under the condition that a dose amount per unit area of the charged particle beam device is larger than that of the second image.

4. The training method according to claim 3, wherein the first image is acquired in a state in which a number of integrated frames of the charged particle beam device or a beam current is larger, a scanning speed of a charged particle beam is slower, or a field of view of the charged particle beam device is smaller than that of the second image.

5. The training method according to claim 1, wherein the first image and a plurality of second images are acquired, a plurality of second index values are extracted from the plurality of second images, and the plurality of extracted second index values are compared with a first index value extracted from the first image.

6. The training method according to claim 1, wherein the index value is a dimension value or an area value of a pattern included in the first image and the second image.

7. The training method according to claim 1, wherein the first image generation tool is configured to generate a higher quality image than the second image generation tool.

8. The training method according to claim 1, wherein the first image generation tool is equipped with an aberration corrector.

9. The training method according to claim 8, wherein the image generation tool generates an image of a semiconductor pattern,
the first image is generated under the first image generation condition including aberration correction,
the second image is generated under the second image generation condition that does not include aberration correction, and
in the second image, the index value extracted from the second image is one or more of resolution of the semiconductor pattern, line edge roughness of a line pattern, and line width roughness of the line pattern.

10. The training method according to claim 9, wherein the image generation tool is a charged particle beam device,
the semiconductor pattern has a predetermined height, and
the height of the pattern is less than an imaging depth of focus of the first image generation tool and greater than an imaging depth of focus of the second image generation tool.

11. The training method according to claim 10, wherein in the semiconductor pattern, a variation in the index value extracted from the first image caused by non-chargeability or a potential change due to irradiation with a charged particle beam is less than or equal to a threshold.

12. The training method according to claim 9, wherein line edge roughness or line width roughness including predetermined amplitude or frequency information is built into the semiconductor pattern, or the semiconductor pattern is known.

13. A system configured to generate a converted image based on input of an input image, comprising:
one or more computer subsystems that train a learning apparatus configured to generate a converted image based on the input of the input image and one or more components executed by the one or more computer subsystems, wherein
the one or more components execute learning by inputting a first image generated under a first image generation condition and a second image generated under a second image generation condition different from the first image generation condition to the learning apparatus that adjusts parameters so as to suppress an error between the input image and the converted image one or more times during learning from an input device,
the second image is selected such that an index value extracted from the second image is the same as or has a predetermined relationship with an index value extracted from the first image, or
the second image is output from a second image generation tool different from a first image generation tool for generating the first image.

14. The system according to claim 13, wherein the one or more components train the learning apparatus with teacher data including the first image and the selected second image.

15. The system according to claim 14, wherein the one or more components select a second image that satisfies a predetermined condition based on an execution of dimension measurement or area measurement of a pattern included in a plurality of second images generated under the second image generation condition, compare a measurement value of the selected second image with a measurement value of the first image, and select the second image based on the comparison.

16. The system according to claim 14, wherein
the first image generation tool and the second image generation tool include the component,
a first component and a second component are connected through a network,
the first component trains the learning apparatus based on input of images output from the first image generation tool and the second image generation tool, and
the trained model is introduced into the second component via the network.

17. A non-transitory computer-readable medium storing a program configured to instruct a processor to train a learning apparatus configured to generate a converted image based on input of an image, wherein
the program causes learning to be executed by inputting a first image generated under a first image generation condition and a second image generated under a second image generation condition different from the first image generation condition to the learning apparatus that adjusts parameters so as to suppress an error between the input image and the converted image one or more times during learning from an input device,
the second image is selected such that an index value extracted from the second image is the same as or has a predetermined relationship with an index value extracted from the first image, or
the second image is output from a second image generation tool different from a first image generation tool for generating the first image.

* * * * *